(12) United States Patent
Nakagawa (10) Patent No.: US 8,395,420 B2
(45) Date of Patent: Mar. 12, 2013

(54) INPUT BUFFER CIRCUIT

(75) Inventor: Hiroshi Nakagawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 113 days.

(21) Appl. No.: 12/875,836

(22) Filed: Sep. 3, 2010

(65) Prior Publication Data

US 2011/0057687 A1 Mar. 10, 2011

(30) Foreign Application Priority Data

Sep. 7, 2009 (JP) ................. 2009-205820

(51) Int. Cl.
*H03K 3/00* (2006.01)

(52) U.S. Cl. ...................................... 327/108

(58) Field of Classification Search .................. None
See application file for complete search history.

(56) References Cited

U.S. PATENT DOCUMENTS

| | | | | |
|---|---|---|---|---|
| 3,991,380 A | * | 11/1976 | Pryor | 330/253 |
| 5,719,529 A | * | 2/1998 | Kawahara et al. | 330/253 |
| 5,999,020 A | * | 12/1999 | Volk et al. | 327/67 |
| 6,137,320 A | | 10/2000 | Takai | |
| 6,452,429 B1 | * | 9/2002 | Lim | 327/108 |
| 6,504,405 B1 | * | 1/2003 | Nguyen et al. | 327/67 |
| 6,696,878 B1 | * | 2/2004 | Haskin | 327/333 |
| 6,781,428 B2 | * | 8/2004 | Chao et al. | 327/206 |
| 6,897,684 B2 | | 5/2005 | Oi et al. | |
| 7,459,944 B2 | * | 12/2008 | Cowles et al. | 327/108 |
| 7,639,043 B2 | * | 12/2009 | Koike | 326/82 |
| 7,982,509 B2 | * | 7/2011 | Cowles | 327/108 |
| 2003/0169076 A1 | | 9/2003 | Oi et al. | |

FOREIGN PATENT DOCUMENTS

| | | |
|---|---|---|
| JP | 11-266152 | 9/1999 |
| JP | 2003-258624 | 9/2003 |
| JP | 2009-104694 | 5/2009 |

* cited by examiner

*Primary Examiner* — Lincoln Donovan
*Assistant Examiner* — Khareem E Almo
(74) *Attorney, Agent, or Firm* — Morrison & Foerster LLP (57) ABSTRACT

There are provided a differential input circuit, a PMOS transistor 20 that connects between a power supply VDD and one of power supplies of the differential input circuit and that enables switching between an operation state and a non-operating state of the differential input circuit, and a PMOS transistor 14 that is connected in parallel with the PMOS transistor 20 and that receives an output signal of the differential input circuit at its gate. The size of the PMOS transistor 20 is smaller than the size of the PMOS transistor 14. There are further provided an NMOS transistor 19 that connects between a ground and the other power supply of the differential input circuit and that enables switching between an operation state and a non-operating state of the differential input circuit, and an NMOS transistor 13 that is connected in parallel with the NMOS transistor 19 and that receives the output signal of the differential input circuit at its gate. The size of the NMOS transistor 19 is smaller than the size of the NMOS transistor 13.

15 Claims, 5 Drawing Sheets

INPUT BUFFER CIRCUIT

TECHNICAL FIELD

This application is based upon and claims the benefit of the priority of Japanese patent application No. 2009-205820 filed on Sep. 7, 2009, the disclosure of which is incorporated herein in its entirety by reference thereto.

REFERENCE TO RELATED APPLICATION

The present invention relates to an input buffer circuit, and particularly to an input buffer circuit comprising an input circuit that transmits a signal supplied externally to an internal circuit.

BACKGROUND

In a semiconductor memory device such as SDRAM, signals such as a clock signal, an address signal, and a data signal are received by an input buffer circuit first and transmitted to an internal circuit as an internal clock signal, an internal address signal, and an internal data signal respectively. As the speed of semiconductor memory devices increases, a high-speed differential circuit is often used as such an input buffer circuit (refer to Patent Documents 1 and 2).

Figure 5:
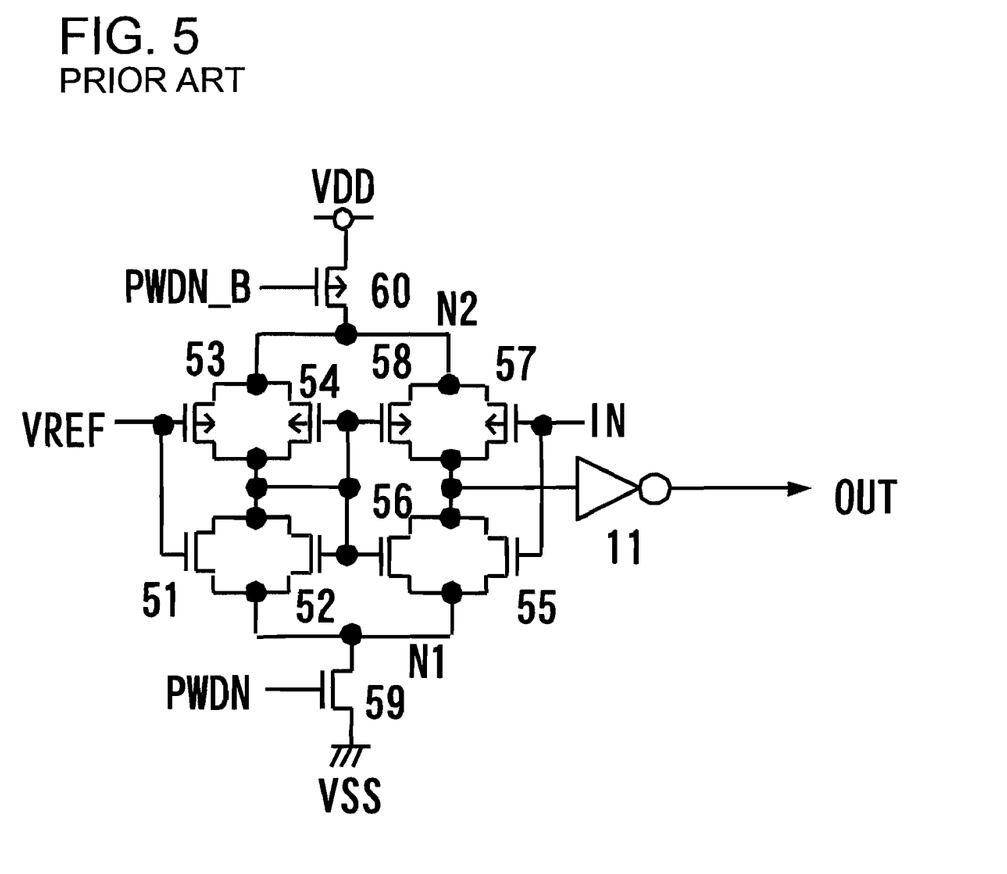
FIG. 5 is a circuit diagram of a conventional input buffer circuit.

FIG. 5 is a circuit diagram corresponding to an input buffer circuit described in Patent Document 1. In FIG. 5, the input buffer circuit (input first stage circuit) comprises a differential circuit constituted by N-channel MOS transistors 51 and 52, a differential circuit constituted by P-channel MOS transistors 53 and 54, a differential circuit constituted by N-channel MOS transistors 55 and 56, and a differential circuit constituted by P-channel MOS transistors 57 and 58.

Sources of the N-channel MOS transistors 51 and 52 are connected to each other, and this node N1 is connected to a drain of the N-channel MOS transistor 59. A source of the N-channel MOS transistor 59 is grounded (VSS). Sources of the P-channel MOS transistors 53 and 54 are connected each other, and this connection node N2 is connected to a drain of the P-channel MOS transistor 60. A source of the P-channel MOS transistor 60 is connected to a power supply VDD. Each drain of the N-channel MOS transistors 51 and 52 is connected to each drain of the P-channel MOS transistors 53 and 54.

Sources of the N-channel MOS transistors 55 and 56 are connected to each other, and this connection node N1 is connected to the drain of the N-channel MOS transistor 59. Sources of the P-channel MOS transistors 57 and 58 are connected to each other, and this connection node N2 is connected to the drain of the P-channel MOS transistor 60. Each drain of the N-channel MOS transistors 55 and 56 is connected to each drain of the P-channel MOS transistors 57 and 58.

Gates of the N-channel MOS transistor 51 and the P-channel MOS transistor 53 are connected to each other, and a reference voltage (reference level signal) VREF is applied to them.

Each gate of the N-channel MOS transistor 52 and the P-channel MOS transistor 54 is connected in common to each drain of the N-channel MOS transistors 51 and 52 and the P-channel MOS transistors 53 and 54. Further, gates of the N-channel MOS transistor 56 and the P-channel MOS transistor 58 are connected in common to each drain of the N-channel MOS transistors 51 and 52 and the P-channel MOS transistors 53 and 54.

Gates of the N-channel MOS transistor 55 and the P-channel MOS transistor 57 are connected together, and an external input signal IN such as a command/address signal is applied to them.

An output signal OUT is outputted from a node between the drains of the N-channel MOS transistors 55 and 56 and the drains of the P-channel MOS transistors 57 and 58 via an inverter circuit 11.

Since the input buffer circuit is constituted as a differential circuit as described, a direct current (short-circuit current, i.e., a power supply current) flows even during standby mode. Therefore, using a power control signal PWDN and an inverted signal PWDN_B of the power control signal PWDN, the input buffer circuit is activated when the external input signal IN is received, and the power supply to the input buffer circuit is cut off during the standby mode.

The power control signal PWDN is supplied to a gate of the N-channel MOS transistor 59 and the inverted signal PWDN_B of the power control signal PWDN is supplied to a gate of the P-channel MOS transistor 60. When the power control signal PWDN is at a high level, the N-channel MOS transistor 59 and the P-channel MOS transistor 60 become conductive, and the input buffer circuit is activated. On the other hand, when the power control signal PWDN is at a low level, the N-channel MOS transistor 59 and the P-channel MOS transistor 60 become nonconductive, the power supply to the input buffer circuit is cut off.

Further, Patent Document 3 discloses an input buffer circuit having a differential amplifier circuit that receives an external input signal and a reference voltage for determining the level of the input signal, a transistor for a first operating current path that supplies a predetermined first operating current to the differential amplifier circuit and that always remains ON due to a predetermined fixed voltage supplied to its gate, and at least one transistor for a second operating current path that supplies a second operating current greater than the first operating current to the differential amplifier when in the ON state and that is ON/OFF controlled according to an external control signal.

[Patent Document 1] Japanese Patent Kokai Publication No. JP-P2009-104694A

[Patent Document 2] Japanese Patent Kokai Publication No. JP-A-11-266152

[Patent Document 3] Japanese Patent Kokai Publication No. JP-P2003-258624A

SUMMARY

The entire disclosures of the above patent documents are incorporated herein by reference thereto. The following analysis on the related technologies is given by the present invention.

Differential input circuits are used in various electronic devices, however, since a direct current (short-circuit current, i.e., a power supply current) constantly flows in a differential circuit, there is an issue in terms of current consumption. In this case, the issue is a tradeoff between the current consumption and the response speed in the differential circuit. In other words, since the response speed decreases when the current consumption is suppressed, a certain amount of current consumption must be tolerated.

For instance, in the circuits described in Patent Documents 1 and 2, when the input receiver circuit is operated, the current consumption becomes large because the short-circuit current constantly flows. Similarly, in the circuit described in Patent Document 3, the current consumption during normal operation becomes large since the transistor for the first operating current path is always ON during the normal operation and the short-circuit current continues to flow through the both transistors for the first and the second operating current paths. In these cases, the amount of the short-circuit current can be reduced by decreasing the size of the transistor disposed between the input circuit and the power supply node, thereby decreasing its current driving ability. However, for instance, in the circuit described in Patent Document 1, this will slow down the charge/discharge speed of the nodes N1 and N2 in FIG. 5 and decrease the response speed of the input circuit to a transition of the logic level of the external input signal IN. Thus there is much to be desired in the art.

According to a first aspect of the present invention, there is provided an input buffer circuit comprising: a differential input circuit, a first transistor of a first conductivity type that connects between a first power supply and one of power supplies of the differential input circuit and that enables switching between an operation state and a non-operating state of the differential input circuit; and a second transistor of the first conductivity type that is connected in parallel with the first transistor of the first conductivity type and that receives an output signal of the differential input circuit at its control node. According to a second aspect of the present invention, there is provided a device comprising: an input buffer circuit operating on a first power supply voltage and including first and second input nodes, a first power supply node and an output node, the input buffer circuit outputting an output signal relevant to voltage levels at the first and second input nodes thereof to the output node thereof; a first power supply line supplying the first power supply node of the input buffer circuit with a first power supply potential as one of potentials of the first power supply voltage; a first transistor coupled between the first power supply line and the first power supply node of the input buffer circuit and rendered conductive during a time period in which the input buffer circuit is in an active state; and a second transistor coupled between the first power supply line and the first power supply node of the input buffer circuit in parallel to the first transistor and receiving a control signal relevant to the output signal at a control node thereof and the second transistor being larger in transistor size than the first transistor. According to a third aspect of the present invention, there is provided a device comprising: an input buffer circuit operating on a first power supply voltage and including first and second input nodes, first and second power supply nodes and an output node, the input buffer circuit outputting an output signal relevant to voltage levels at the first and second input nodes thereof to the output node thereof; a first power supply line supplying the first power supply node of the input buffer circuit with a first power supply potential as one of potentials of the first power supply voltage; a second power supply line supplying the second power supply node of the input buffer circuit with a second power supply potential as the other of the potentials of the first power supply voltage; a first transistor coupled between the first power supply node of the input buffer circuit and the first power supply line; and a second transistor coupled between the second power supply node of the input buffer circuit and the second power supply line, one of the first and the second transistors being selectively rendered conductive in response to a logic level of the output signal while the other of the first and the second transistors being rendered nonconductive during a time period in which the input buffer is in an active state.

The meritorious effects of the present invention are summarized as follows.
According to the present invention, the first transistor of the first conductivity type reduces the amount of the short-circuit current that flows during the operation of the differential input circuit, and a decrease in the response speed of the differential input circuit to a transition of the logic level of an input signal can be suppressed by supplying the output signal of the differential input circuit to the control node of the second transistor of the first conductivity type and ON/OFF controlling the second transistor of the first conductivity type with the logic level of the output signal.

PREFERRED MODES

An input buffer circuit relating to a mode of the present invention comprises a differential input circuit, a first transistor of a first conductivity type that connects between a first power supply and one of power supplies of the differential input circuit and that enables switching between an operation state and a non-operating state of the differential input circuit, and a second transistor of the first conductivity type that is connected in parallel with the first transistor of the first conductivity type and that receives an output signal of the differential input circuit at its control node.

In the input buffer circuit, it is preferable that the size of the first transistor of the first conductivity type be smaller than the size of the second transistor of the first conductivity type.

It is preferable that the input buffer circuit further comprise: a first transistor of a second conductivity type that connects between a second power supply and the other power supply of the differential input circuit and that enables switching between an operation state and a non-operating state of the differential input circuit; and a second transistor of the second conductivity type that is connected in parallel with the first transistor of the second conductivity type and that receives the output signal of the differential input circuit at its control node.

In the input buffer circuit, it is preferable that the size of the first transistor of the second conductivity type be smaller than the size of the second transistor of the second conductivity type.

In the input buffer circuit, it is preferable that the differential input circuit invert an input signal and output the resultant signal as the output signal.

A semiconductor memory device may comprise the input buffer circuit described above.

In the input buffer circuit described above, the short-circuit current is suppressed by narrowing the gate widths of the first transistor of the first conductivity type and the first transistor of the second conductivity type, which serve as a current source, to for instance a quarter. Next, the second transistor of the first conductivity type and/or the second transistor of the second conductivity type having a large gate width, which serves as a current source, is newly added. Note that the output signal is fed back to the control node of the second transistor of the first conductivity type and/or the second transistor of the second conductivity type. In the configuration described above, the increase in the short-circuit current is relatively small because only one of the added current sources, i.e., the second transistor of the first conductivity type and the second transistor of the second conductivity type turns on.

The feedback signal of the output signal turns on one of the current sources of either the second transistor of the first conductivity type or the second transistor of the second conductivity type after a first level of the input signal has been received, and this improves the response to a transition to a second level of the input signal. Meanwhile, after the second level of the input signal has been received, the other current source of the second transistor of the first conductivity type and the second transistor of the second conductivity type is turned on, thereby improving the response to a transition to the first level of the input signal.

According to the input buffer circuit described above, the current consumption can be suppressed without sacrificing the response speed to the input signal.

In the second aspect, there are possible modes as follows.

The input circuit may include a second power supply node, and the device may further comprise: a second power supply line supplying the second power supply node of the input buffer circuit with a second power supply potential as the other of the potentials of the first power supply voltage, a third transistor coupled between the second power supply line and the second power supply node of the input buffer circuit and rendered conductive during the time period, and a fourth transistor coupled between the second power supply line and the first power supply node of the input buffer circuit in parallel to the first transistor and receiving the control signal relevant to the output signal at a control node thereof and the fourth transistor being larger in transistor size than the third transistor.

The first and the second transistors may be of a first conductivity type and the third and the fourth transistors may be of a second conductivity type different from the first conductivity type.

The device may further comprise a circuit unit receiving the output signal and inverting the output signal so as to generate the control signal.

The input buffer circuit may compare the voltage level of the first input node thereof with the voltage level of the second input node thereof, drive the output signal to a first logic level when the voltage level of the first input node thereof is higher than the voltage level of the second input node thereof and drive the output signal to a second logic level different from the first logic level when the first input node thereof is lower than the logic level of the second input node thereof, the second transistor may be rendered conductive when the output signal takes the first logic level and is rendered nonconductive when the output signal takes the second logic level, and fourth transistor may be rendered conductive when the output signal takes the second logic level and in rendered nonconductive when the output signal takes the first logic level.

In the third aspect, there are possible modes as follows.

The first transistor may be rendered conductive when the output signal takes a first logic level and in rendered nonconductive when the output signal takes a second logic level different from the first logic level, and the second transistor may be rendered nonconductive when the output signal takes the first logic level and may be rendered conductive when the output signal takes the second logic level.

The device may further comprise: a third transistor coupled between the first power supply node of the input buffer circuit and the first power supply line in parallel to the first transistor, the third transistor being smaller in transistor size than the first transistor, and a fourth transistor coupled between the second poser supply node of the input buffer circuit and the second pose supply line in parallel to the second transistor, the fourth transistor being in transistor size than the second transistor.

The examples will be described in detail below with reference to the drawings.

EXAMPLE 1

Figure 1:
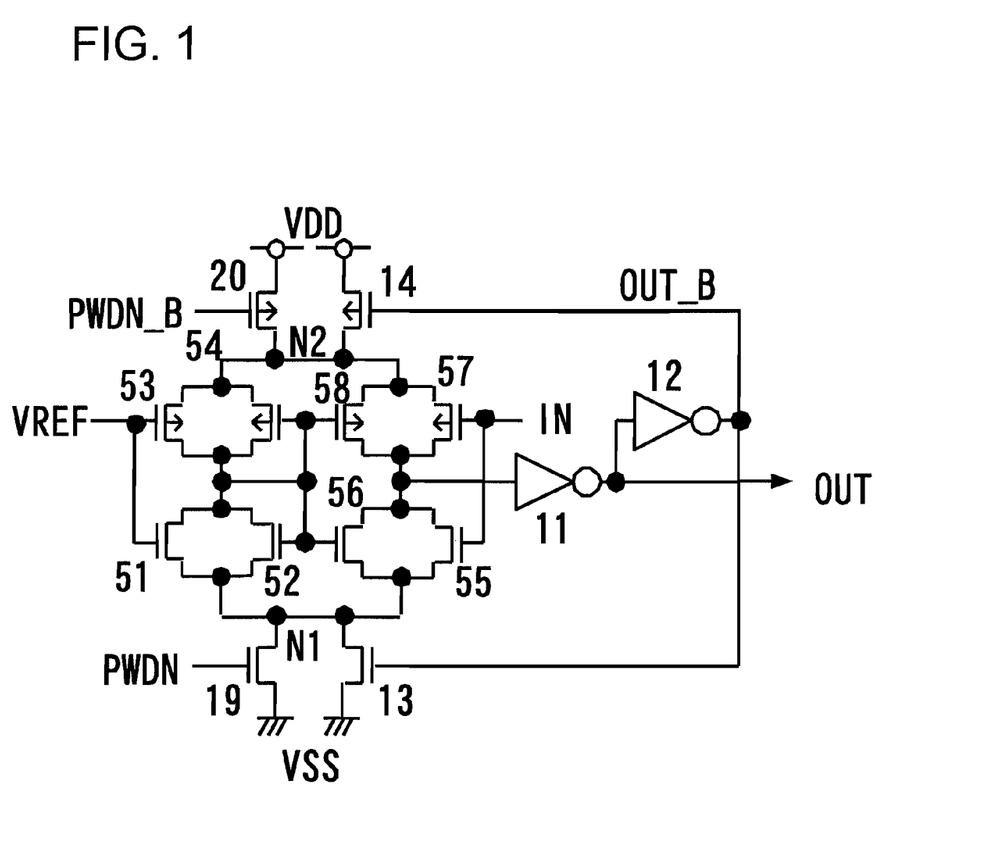
FIG. 1 is a circuit diagram of an input buffer circuit relating to a first example of the present invention.

FIG. 1 is a circuit diagram of an input buffer circuit relating to a first example of the present invention. In FIG. 1, the same symbols as those in FIG. 5 represent the same things, thus the explanations will be omitted. The input buffer circuit in FIG. 1 further comprises an inverter circuit 12, an NMOS transistor 13, and a PMOS transistor 14, in addition to the configuration shown in FIG. 5. It should be noted that "NMOS transistor" means N-channel MOS transistor and "PMOS transistor" means P-channel MOS transistor.

The inverter circuit 12 inverts the output signal OUT having the same phase as the input signal IN and supplies the resultant signal to each gate of the NMOS transistor 13 and the PMOS transistor 14 as a signal OUT_B. The NMOS transistor 13 has its source grounded and its drain connected to a connection node N1. The size (gate width) of the NMOS transistor 13 is equal to that of the NMOS transistor 55. Further, the PMOS transistor 14 has its source connected to the power supply VDD and its drain connected to a connection node N2. The size (gate width) of the PMOS transistor 14 is equal to that of the PMOS transistor 57.

Further, an NMOS transistor 19 and a PMOS transistor 20 are connected as the NMOS transistor 59 and the PMOS transistor 60 in FIG. 5 respectively, however, the size (gate width) of each transistor is, for instance, a quarter of that of the NMOS transistor 55 and the PMOS transistor 57 respectively.

In the input buffer circuit configured as described, when the input signal IN is at a high level, the signal OUT_B goes to a low level, thereby turning the PMOS transistor 14 on. Therefore the connection node N2 is connected to the power supply node (VDD) via both the PMOS transistors 14 and 20. As a result, the potential of the connection node N2 assumes a potential higher than when only the PMOS transistor 20 is used. When the input signal IN transitions to a low level in this state, a gate-source voltage Vgs of the PMOS transistor 57 having its gate receive the input signal IN and its source connected to the connection node N2 becomes larger than the case when only the PMOS transistor 20 is used. As a result, a decrease in the response characteristic of the input buffer circuit to the transition of the input signal IN to the low level can be suppressed.

Meanwhile, an operation corresponding to the one described above is performed in cases where the input signal IN transitions to the high level from the low level. In other words, when the input signal IN is at the low level, the signal OUT_B goes to the high level, thereby turning the NMOS transistor 13 on. Therefore the node connection N1 is connected to the ground (VSS) via both the NMOS transistors 13 and 19. As a result, the potential of the node connection N1 assumes a potential lower than when only the NMOS transistor 19 is used. When the input signal IN transitions to the high level in this state, a gate-source voltage Vgs of the NMOS transistor 55 having its gate receive the input signal IN and its source connected to the node connection N1 becomes larger than the case when only the NMOS transistor 19 is used. As a result, a decrease in the response characteristic of the input buffer circuit to the transition of the input signal IN to the high level can be suppressed.

Figure 2:
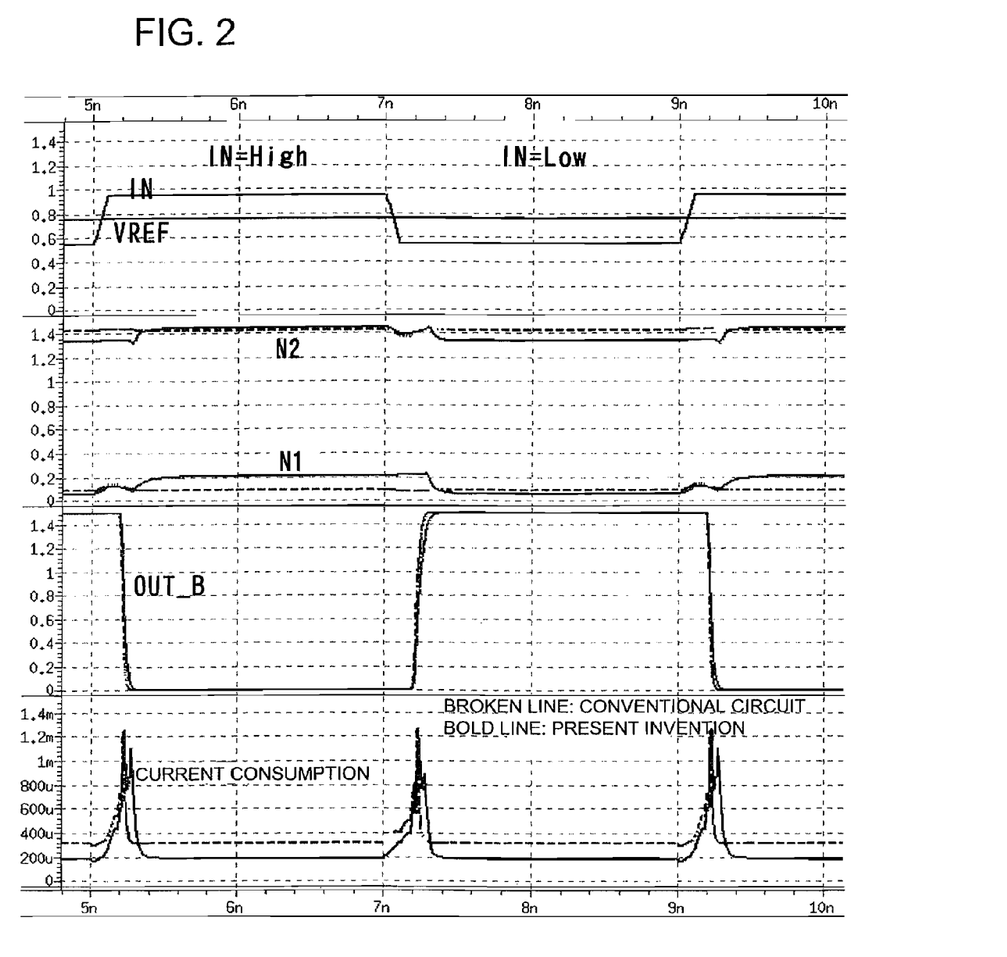
FIG. 2 shows a timing chart of each section in the input buffer circuit relating to the first example of the present invention.

Next, waveforms of each section will be described. FIG. 2 shows a timing chart of each section in the input buffer circuit relating to the first example of the present invention. When the input signal IN is at the high level, the low level of the signal OUT_B is fed back to the gates of the PMOS transistor 14 and the NMOS transistor 13, turning the PMOS transistor 14 on and the NMOS transistor 13 off. As a result, the potential level of the connection node N2 gets closer to VDD and the circuit maintains a high speed of response to the transition of the input signal IN to the low level.

Further, when the input signal IN is at the low level, the high level of the signal OUT_B is fed back to the gates of the PMOS transistor 14 and the NMOS transistor 13, turning the NMOS transistor 13 on and the PMOS transistor 14 off. As a result, the potential level of the node connection N1 gets closer to the ground potential and the circuit maintains a high speed of response to the transition of the input signal IN to the high level.

With reference to FIG. 2, the waveform of the signal OUT_B in this example is nearly equivalent to that in the conventional circuit. On the other hand, compared to the conventional circuit; the current consumption is reduced by 30 to 40 percent in the input buffer circuit of the present invention since the sizes of the NMOS transistor 19 and the PMOS transistor 20 turned on are small.

EXAMPLE 2

Figure 3:
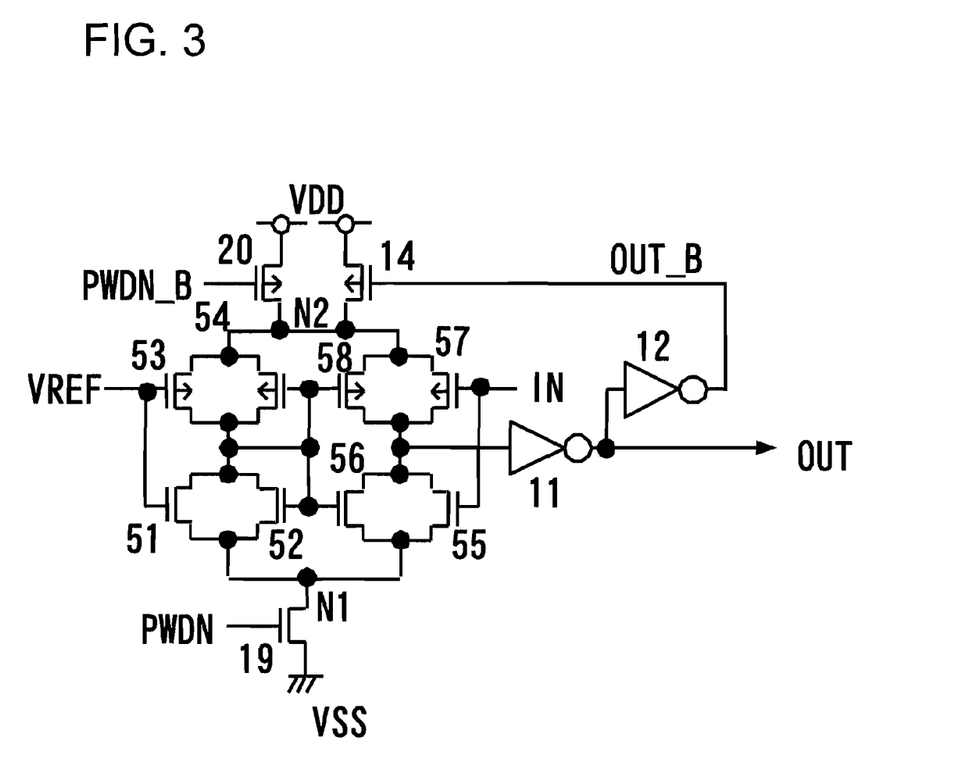
FIG. 3 is a circuit diagram of an input buffer circuit relating to a second example of the present invention.

FIG. 3 is a circuit diagram of an input buffer circuit relating to a second example of the present invention. In FIG. 3, the same symbols as those in FIG. 1 represent the same things, thus the explanations will be omitted. The input buffer circuit in FIG. 3 lacks the NMOS transistor 13, compared to the circuit in FIG. 1. In other words, both the PMOS transistors 14 and 20 are disposed on the side of the power supply VDD, and only the NMOS transistor 19 is disposed on the ground side.

Since the input buffer circuit configured as described lacks the NMOS transistor 13 in FIG. 1, the response speed to the rising edge of the input signal IN decreases as compared with the case of FIG. 1. On the other hand, the response speed to the falling edge of the input signal IN is maintained by the PMOS transistor 14 kept on.

EXAMPLE 3

Figure 4:
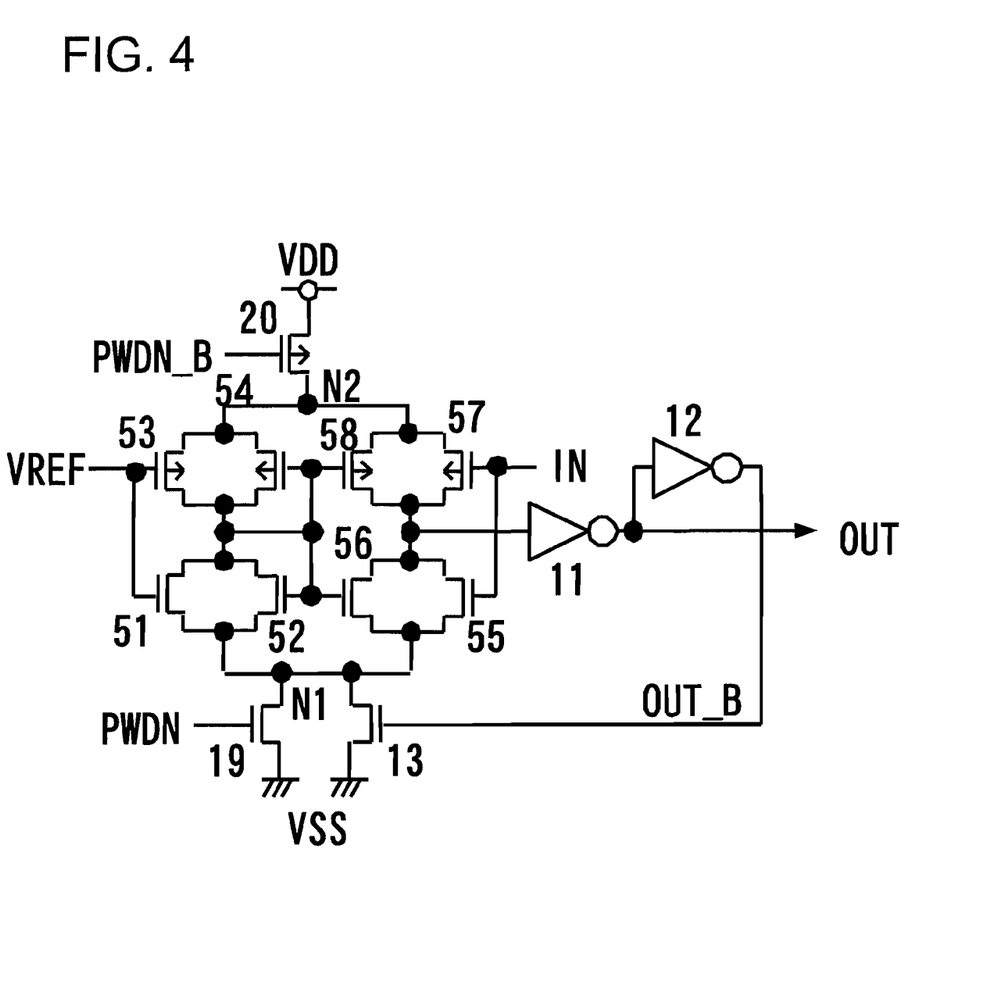
FIG. 4 is a circuit diagram of an input buffer circuit relating to a third example of the present invention.

FIG. 4 is a circuit diagram of an input buffer circuit relating to a third example of the present invention. In FIG. 4, the same symbols as those in FIG. 1 represent the same things, thus the explanations will be omitted. The input buffer circuit in FIG. 4 lacks the PMOS transistor 14, compared to the circuit in FIG. 1. In other words, only the PMOS transistor 20 is disposed on the side of the power supply VDD, and both the NMOS transistors 13 and 19 are disposed on the ground side.

Since the input buffer circuit configured as described lacks the PMOS transistor 14 in FIG. 1, the response speed to the falling edge of the input signal IN decreases as compared with the case of FIG. 1. On the other hand, the response speed to the rising edge of the input signal IN is maintained by the NMOS transistor 13 kept on.

Note that the differential input circuit constituted by the NMOS transistors 51, 52, 55, and 56, and the PMOS transistors 53, 54, 57, and 58 is not limited to the circuit described in each example described above. Instead of the differential input circuit described in each example above, input circuits in other forms, for instance, circuits described in FIGS. 2 and 4 in Patent Document 3 may be used.

It should be noted that other objects, features and aspects of the present invention will become apparent in the entire disclosure and that modifications may be done without departing the gist and scope of the present invention as disclosed herein and claimed as appended herewith. Also it should be noted that any combination, selection and modification of the disclosed and/or claimed elements, matters and/or items may fall under the modifications aforementioned.

What is claimed is:

1. A device comprising:
an input circuit receiving first and second input signals, outputting an output signal in response to the first and second input signals and including a first power supply node and a second power supply node;
a first power supply line;
a first transistor coupled between the first power supply line and the first power supply node of the input circuit and including a first control terminal configured to receive a first control signal, the first control signal changing a level thereof in response to a change in a level of at least one of the first and second input signals and the output signal;
a second transistor coupled in parallel to the first transistor between the first power supply line and the first power supply node of the input circuit and including a second control terminal configured to receive a second control signal, the second control signal changing a level thereof independently of each of the first and second input signals and the output signal;
a second power supply line;
a third transistor coupled between the second power supply line and the second power supply node of the input circuit and including a third control terminal configured to receive a third control signal, the third control signal being relative to the output signal of the input circuit; and
a fourth transistor coupled in parallel to the third transistor between the second power supply line and the second power supply node of the input circuit and including a fourth control terminal configured to receive a fourth control signal, the fourth control signal changing irrespective of the first and second input signals; wherein
the first power supply line supplies the first power supply node of the input circuit with a first power supply voltage, the second power supply line supplies the second power supply node of the input circuit with a second power supply voltage different from the first power supply voltage.

2. The device as claimed in claim 1, further comprising,
a first input terminal externally supplied the first input signal,
a second input terminal externally supplied the second input signal, and
wherein the first and second input nodes of the input circuit is coupled respectively to the first and second input terminals.

3. The device as claimed in claim 1, wherein the second input signal takes a substantially constant voltage level.

4. The device as claimed in claim 1, wherein the first transistor is conductive in a first period of time when the first input signal takes a first logic level and is nonconductive in a second period of time when the first input signal takes a second logic level and the second transistor is conductive in the first period of time and in the second period of time.

5. The device as claimed in claim 1, wherein the input circuit includes first and second input nodes receiving the first and second input signals, respectively, and an output node outputting the output signal, and the first control node of the first transistor is coupled to the output node of the input circuit.

6. The device as claimed in claim 1, wherein the first transistor is greater in size than the second transistor, and the third transistor is greater in size than the fourth transistor.

7. The device as claimed in claim 6, wherein the first and second transistors are of a first conductivity type and the third and fourth transistors are of a second conductivity type different from the first conductivity type.

8. The device as claimed in claim 1, wherein the first and third control signal is substantially equal in voltage level to each other.

9. The device as claimed in claim 1, wherein the first and third transistors are configured to be rendered conductive exclusively of each other in response to the output signal of the input circuit.

10. A device comprising:
an input circuit receiving a first input signal and outputting an output signal in response to the first input signal, the input circuit including first and second power supply nodes,
a first power supply line configured to supply the first power supply node of the input circuit with a first power supply voltage;
a first transistor coupled between the first power supply line and the first power supply node of the input circuit, the first transistor including a first control terminal configured to receive a first control signal, the first control signal being responsive to the output signal of the input circuit;
a second transistor coupled in parallel to the first transistor between the first power supply line and the first power supply node of the input circuit, the second transistor including a second control terminal configured to receive a second control signal, the second control signal changing a level thereof independently of each of the first input signal and the output signal;
a second power supply line configured to supply the second power supply node of the input circuit with a second power supply voltage that is different in voltage potential from the first power supply voltage;
a third transistor coupled between the second power supply line and the second power supply node of the input circuit, the third transistor including a third control terminal configured to receive a third control signal, the third control signal being responsive to the output signal of the input circuit; and
a fourth transistor coupled in parallel to the third transistor between the second power supply line and the second power supply node of the input circuit, the fourth transistor including a fourth control terminal configured to receive a fourth control signal, the fourth control signal changing a level thereof independently of each of the first input signal and the output signal;
the first and third transistors being configured to be render conductive exclusively of each other.

11. The device as claimed in claim 10, wherein the first transistor is greater in size than the second transistor, and the third transistor is greater in size than the fourth transistor.

12. The device as claimed in claim 10, wherein each of the first and second transistors is a first conductivity type and each of the third and fourth transistors is a second conductivity type that is different from the first conductivity type.

13. The device as claimed in claim 10, wherein the input circuit further receives a second input signal, and compares voltage levels of the first and second input signals with each other to generate the output signal.

14. The device as claimed in claim 10, further comprising a first input terminal externally supplied with the first input signal, and wherein the input circuit is connected to the first input terminal.

15. The device as claimed in claim 10, wherein the input circuit includes an output node from which the output signal is outputted, and each of the first and third control terminals is coupled to the output node of the input circuit.

* * * * *